(12) United States Patent
Kuroda

(10) Patent No.: US 6,366,179 B1
(45) Date of Patent: Apr. 2, 2002

(54) SURFACE ACOUSTIC WAVE ELEMENT HAVING TWO FILTERS WITH MORE IDTS IN THE LOWER FREQUENCY FILTER

(75) Inventor: Yasushi Kuroda, Asahikawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/419,285

(22) Filed: Oct. 15, 1999

(51) Int. Cl.[7] .............................. H03H 9/72; H03H 9/64
(52) U.S. Cl. ........................................ 333/133; 333/193
(58) Field of Search .......................... 333/133, 193–196

(56) References Cited

U.S. PATENT DOCUMENTS

| | | | |
|---|---|---|---|
| 5,694,096 A | * 12/1997 | Ushiroku et al. | 333/193 X |
| 5,717,367 A | * 2/1998 | Murai | 333/193 X |
| 5,864,260 A | * 1/1999 | Lee | 333/133 |
| 5,874,869 A | * 2/1999 | Ueda et al. | 333/193 |
| 5,966,060 A | * 10/1999 | Ikada | 333/193 |
| 6,057,744 A | * 5/2000 | Ikada | 333/133 |

FOREIGN PATENT DOCUMENTS

| | | | | |
|---|---|---|---|---|
| JP | 1-231417 | * | 9/1989 | 333/193 |
| JP | 4-207615 | | 7/1992 | |
| JP | 5-183380 | | 7/1993 | |
| JP | 6-260876 | | 9/1994 | |
| JP | 7-66679 | * | 3/1995 | |
| JP | 8-65097 | | 3/1996 | |

* cited by examiner

*Primary Examiner*—Robert Pascal
*Assistant Examiner*—Barbara Summons
(74) *Attorney, Agent, or Firm*—Oblon, Spivak, McClelland, Maier & Neustadt, P.C.

(57) ABSTRACT

A surface acoustic wave element, comprising a piezoelectric substrate, a first surface acoustic wave resonant filter having a first IDT group consisting of a conductive film disposed on the piezoelectric substrate to utilizing longitudinal resonance mode coupling, and having a first passband, and a second surface acoustic wave resonant filter having a second IDT group consisting of a conductive film disposed on the piezoelectric substrate to utilizing longitudinal resonance mode coupling, and having a second passband of higher frequency than that of the first passband, wherein a number of IDTs constituting the first IDT group is more than that of the IDTs constituting the second IDT group.

11 Claims, 6 Drawing Sheets

SURFACE ACOUSTIC WAVE ELEMENT HAVING TWO FILTERS WITH MORE IDTS IN THE LOWER FREQUENCY FILTER

BACKGROUND OF THE INVENTION

The present invention relates to a composite filter for vehicular communication employing surface acoustic waves, in particular relates to a two-port surface acoustic wave resonant filter utilizing longitudinal resonance mode coupling disposed on one substrate and having different passbands.

In RF SAW filters being used in cellular telephones and portable telephones, ones that have passbands thereof mainly in the frequency band of from several hundreds MHz to several GHz are used.

Frequencies of SAW filters and necessary passbands thereof are decided according to systems to be incorporated and in general the specific bandwidths of several % are required.

The SAW filters of aforementioned usage are also necessary to be low in insertion loss. For example, ladder filters connected surface acoustic wave resonators in a ladder as disclosed in Japanese Patent Laid-open Application (KOKAI) No. HEI 5-183380, or longitudinal mode-coupled resonant filters in which a plurality of interdigital transducers (hereinafter refer to as IDT) are sandwiched by reflectors, as disclosed in Japanese Patent Laid-open Application (KOKAI) No. HEI 4-207615, have been mainly used. Further, these have been frequently used in combination (for instance, Japanese Patent Laid-open Application (KOKAI) No. HEI 8-65097). In any constitutions thereof, filters of relatively low loss can be constituted.

In applying these SAW filters in RF filters for portable telephones, passband widths that can be obtained depend largely on electromechanical coupling factors ($k^2$) of piezoelectric substrates thereon the filters are formed. Accordingly, the piezoelectric substrates such as 36° Y-X LiTaO$_3$, 64° Y-X LiNbO$_3$, or 41° Y-X LiNbO$_3$ and so on of relatively large electromechanical coupling factor have been largely used.

In many of these piezoelectric substrates, when the thickness of a metal film formed thereon is increased, the conversion loss from surface acoustic waves to bulk waves increases, resulting in an increase of the insertion loss of the filter formed with that thickness.

When the thickness of a metal film is made thin, the electric resistance of an electrode formed on a piezoelectric substrate increases, resulting in an increase of the insertion loss.

As the result of these, in these piezoelectric substrates, a normalized film thickness of approximately several % (from approximately 3 to approximately 8%) becomes the best value, the normalized film thickness being one that is normalized by a wavelength of a propagating surface acoustic wave.

RF filters for portable telephones are being adopted in the following places.

One is a portion called a duplexer (transmission/reception switching element) that sends signals from an antenna to a receiving circuit or signals from a transmitting circuit to an antenna.

In a receiving stage, a RF filter is used as a receiving filter that after the signals from an antenna are amplified through a low noise amplifier, eliminates unnecessary signals. Similarly in a transmitting circuit, the RF filter is used as a filter of a transmitting stage.

In the receiving stage, the signals passed through the receiving filter are further mixed with signals from another high-frequency oscillator and are further sent to an intermediate-frequency filter. At this time, also to the signals from the aforementioned high-frequency oscillator, the RF filters are used.

So far, in such portable telephones, except for the duplexer, one filter is used for one passband. There are, however, cases where filters containing a plurality of passbands in one filter are desired.

For instance, there is a case when one filter is demanded to correspond to a plurality of portable telephone systems.

A second case is that the frequency band that has been used is made broader due to an increase of subscribers and a new band exists in distanced frequency from the original one. Even in this case, for all one system, the filter is required to have characteristics as if corresponding to two systems.

In still another case, upon forwarding small size of portable telephones, a compact filter in which a plurality of filters are accommodated together in one package is demanded.

Thus, there are strong demands for composite surface acoustic wave elements in which a plurality of filter characteristics are contained in one package.

Such composite filters are required further to be smaller. On the other hand, in order to constitute a smaller composite filter with surface acoustic wave filters there are the following problems.

First, from a viewpoint of smaller size, it is desirable to form a plurality of surface acoustic filters on a single piezoelectric substrate. Even when considered manufacturing processes, it is desirable to form, through filming and patterning of one conductive film, patterns of IDTs and reflectors from which a plurality of filters are formed.

However, in a composite filter, it is necessary to form a plurality of filters having passbands in different frequencies. A two-port surface acoustic wave resonant filter is liable to be affected on performance in particular by the normalized thickness. Accordingly, in the composite filter in which the two-port surface acoustic wave resonators are used, unless two frequency bands are adjacent (for instance, approximately 80 MHz apart in the neighborhood of 800 MHz), the filter with a single film thickness has been formed with difficulty.

In the case of the frequency bands being distanced more than the above, it is necessary to implement partial additional etching to vary a film thickness of an electrode for each constituting part of a filter. Accordingly productivity of the surface acoustic wave elements is deteriorated.

SUMMARY OF THE INVENTION

The present invention has been made in view of the problems mentioned above.

An object of the present invention is to provide a surface acoustic wave element having a structure that is low in insertion loss, is excellent in attenuation outside the band, can correspond to a plurality of systems or a plurality of frequency bands, is compact, and is high in productivity.

In order to accomplish the aforementioned object, a surface acoustic wave element of the present invention is provided with the following constituent elements and conditions.

A surface acoustic wave element of the present invention comprises a piezoelectric substrate, a first surface acoustic wave resonant filter, and a second surface acoustic wave resonant filter. The first surface acoustic wave resonant filter has a first IDT group consisting of a conductive film disposed on the piezoelectric substrate, and a first passband. The second surface acoustic wave resonant filter has a second IDT group consisting of the conductive film disposed on the piezoelectric substrate, and a second passband higher in frequency than that of the first passband. Here, the number of IDTs constituting the first IDT group is more than that of the IDTs constituting the second IDT group.

By constituting thus, a lower frequency filter necessary for a larger specific bandwidth is increased in kinds of higher modes that can be taken out. Thereby, the lower frequency filter is formed in a structure more appropriate for a broader band.

A surface acoustic wave resonant filter of higher frequency side is easy to make high attenuation in the passband of a surface acoustic wave resonant filter of lower frequency side. Thereby, when two surface acoustic wave resonant filters are connected, the insertion loss of the lower frequency filter can be prevented from increasing.

As the first surface acoustic wave resonant filter and the second surface acoustic wave resonant filter, a two-port surface acoustic wave resonant filter utilizing longitudinal mode coupling, for instance, can be cited.

Thereby, two-port surface acoustic wave resonant filters utilizing longitudinal mode coupling having passbands of different frequencies can be combined to correspond to a plurality of systems or a plurality of frequency bands.

Grounding electrodes of IDTs constituting the first IDT group are disposed electrically independent from each other on the piezoelectric substrate. The grounding electrodes of at least two aforementioned IDTs disposed in an excitation direction of surface acoustic waves among the second IDT group are connected on the piezoelectric substrate. Further, the first surface acoustic wave resonant filter and the second surface acoustic wave resonant filter can be made to have an output terminal connected in common on the piezoelectric substrate.

The bandwidth of the first passband can be set approximately equal to or broader than the bandwidth of the second passband.

The first passband may be set in the range of, for instance, approximately 720 MHz and approximately 745 MHz, and the second passband can be set in the range of, for instance, approximately 930 MHz and approximately 960 MHz.

Further, the first passband may be set in the range of, for instance, approximately 810 MHz and approximately 830 MHz, and the second passband can be set in the range of, for instance, approximately 870 MHz and approximately 887 MHz.

Still further, the first passband may be set in the range of, for instance, approximately 889 MHz and approximately 898 MHz, and the second passband can be set in the range of, for instance, approximately 925 MHz and, approximately 960 MHz.

The passbands shown here are examples of the passbands to which a surface acoustic wave element of the present invention is applicable. And other passbands than these can be also applicable. For instance, in the European GSM system, a center of the first passband is set at 732.5 MHz and a center of the second passband may be set at 947.5 MHz.

As the piezoelectric substrate constituting the surface acoustic wave element of the present invention, for instance, 36° Y-cut X-transmission $LiTaO_3$, 64° Y-cut X-transmission $LiNbO_3$, or 41° Y-cut X-transmission $LiNbO_3$ and so on may be used. The piezoelectric substrates other than these may be used.

These substrates have relatively large electromechanical coupling factors and are easy in selection of an appropriate pass bandwidth.

The surface acoustic wave element of the present invention is characterized in that the first surface acoustic wave resonant filter and the second surface acoustic wave resonant filter are disposed on the piezoelectric substrate along a direction approximately perpendicular to a direction of excitation of the surface acoustic waves.

By adopting such a constitution, the number of reflection electrodes constituting the reflectors can be reduced to make, for instance, smaller the size of the surface acoustic wave element. Even in that case, the surface acoustic waves leaked from one surface acoustic wave resonant filter can be suppressed in affecting to the other surface acoustic wave resonant filter to the minimum level.

A pitch of electrode fingers (distance between a central line of an electrode finger and that of an adjacent electrode finger) of the IDTs of a low passband side filter is formed larger than that of the IDTs of a high passband side filter.

The number of the IDTs constituting the first IDT group is selected from 3, 5, 7 and 9 and is more than that of the IDTs constituting the second IDT group.

The effective and practical combination of the number of the IDTs constituting the first IDT group and that of the IDTs constituting the second IDT group is preferable to be 5:3, 7:3, 7:5, 9:5 and 9:7.

A surface acoustic wave device of the present invention comprises a surface acoustic wave element and an package mounting the surface acoustic wave element. The surface acoustic wave element comprises a piezoelectric substrate, a first surface acoustic wave resonant filter, and a second surface acoustic wave resonant filter. The first surface acoustic wave resonant filter has a first IDT group consisting of a conductive film disposed on the piezoelectric substrate and has a first passband. The second surface acoustic wave resonant filter has a second IDT group consisting of the conductive film disposed on the piezoelectric substrate and has a second passband higher in its frequency than the first passband. Here, the number of IDTs constituting the first IDT group is more than that of the IDTs constituting the second IDT group. The package that mounts the surface acoustic wave element comprises a first input terminal to the first surface acoustic wave filter, a second input terminal to the second surface acoustic wave filter, and an output terminal from the first surface acoustic wave filter and the second surface acoustic wave filter. Here, the first input terminal and the second input terminal, and the output terminal are disposed in a direction approximately parallel with a direction of excitation of the surface acoustic waves of the surface acoustic wave element so as to face each other the surface acoustic wave element therebetween.

The aforementioned two surface acoustic wave filters are electrically connected by use of wire bonding to bonding portions formed on an package accommodating the piezoelectric substrate on which the two filters are formed. In addition to this, two filters are disposed to have a propagating direction of the surface acoustic waves in a direction from the input terminal to the output terminal of terminals of the package and are disposed in a direction approximately perpendicular to the propagating direction of surface acoustic waves.

Two filters are disposed in an approximately perpendicular direction to the propagating direction of the surface acoustic waves. Therefore, even when the number of reflection electrodes of the reflector is reduced for smaller size purpose, leakage surface acoustic wave of one filter hardly affects on the other filter. Since the bonding wires of the input/output can be disposed without crossing the IDTs of the two filters, without disturbing the attenuation out of band, an excellent surface acoustic wave element can be obtained.

DESCRIPTION OF THE PREFERRED EMBODIMENTS

The surface acoustic wave element of the present invention will be explained in detail based on embodiments illustrated in figures.
Embodiment 1

Figure 1:
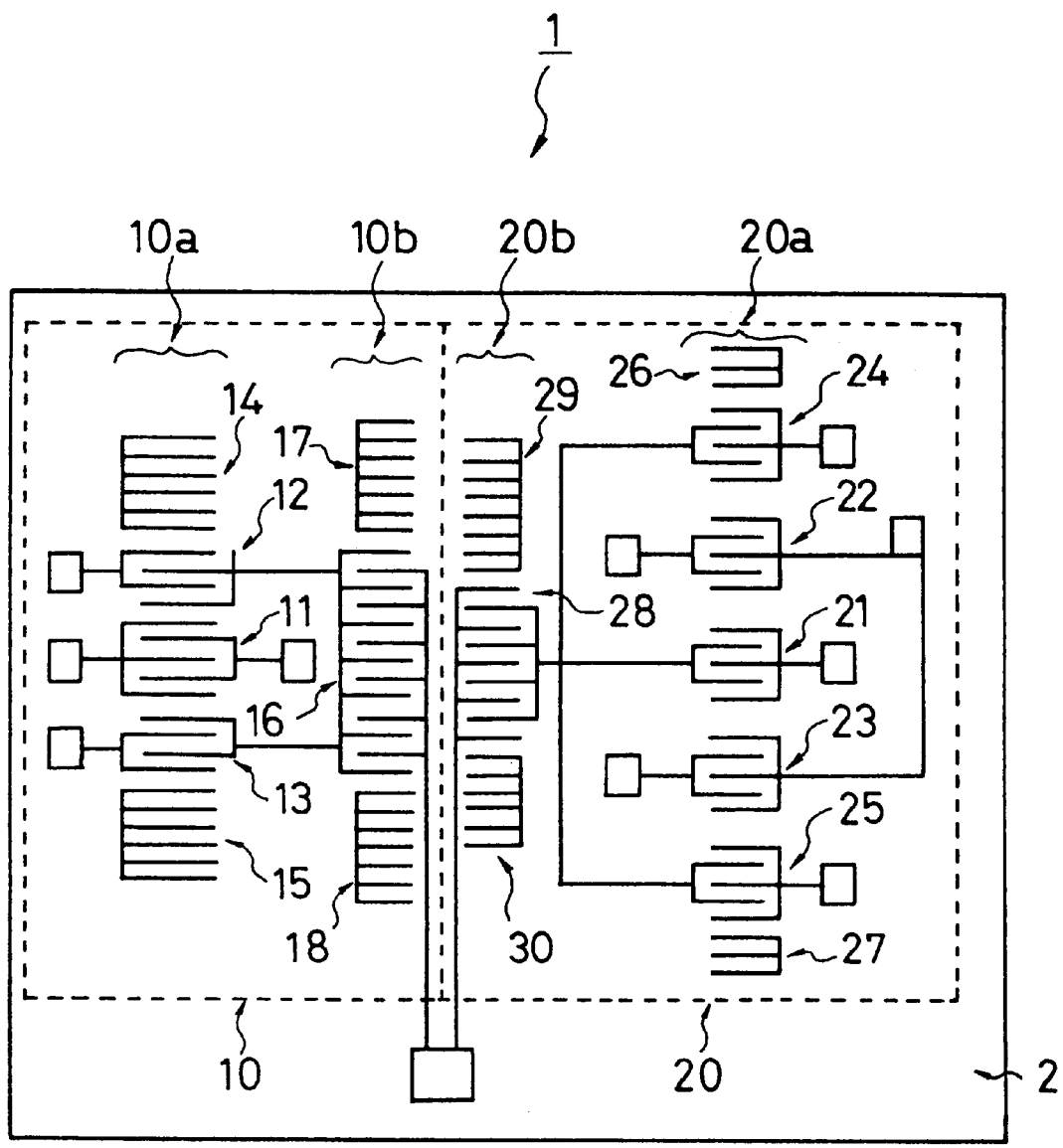
FIG. 1 is a diagram showing schematically an example of constitution of a surface acoustic wave device of the present invention.

FIG. 1 is a diagram showing schematically an example of constitution of a surface acoustic wave element of the present invention.

In this surface acoustic wave element 1, on a piezoelectric substrate 2, two-port surface acoustic wave resonant filters utilizing longitudinal mode coupling 10 and 20 are formed. In this example, for the piezoelectric substrate 2, 36° Y-cut X-transmission LiTaO$_3$ is used.

The surface acoustic wave resonant filter 10 is constituted of a two-port surface acoustic wave resonator 10a, and a surface acoustic wave resonator 10b. The two-port surface acoustic wave resonator 10a consists of three pieces of IDTs 11, 12 and 13 and grating reflectors 14 and 15 disposed so as to sandwich the IDTs. The surface acoustic wave resonator 10b is constituted of an IDT 16 and grating reflectors 17 and 18 disposed so as to hold the IDT 16 therebetween.

The surface acoustic wave resonant filter 20 is constituted of a two-port surface acoustic wave resonator 20a, and a surface acoustic wave resonator 20b. The two-port surface acoustic wave resonator 20a is constituted of five pieces of IDTs 21, 22, 23, 24 and 25 and grating reflectors 26 and 27 disposed so as to hold the IDTs therebetween. The surface acoustic wave resonator 20b consists of an IDT 28 and grating reflectors 29 and 30 disposed so as to hold the IDT 28 therebetween.

The surface acoustic wave element of the present invention has the surface acoustic wave resonator 20a of the surface acoustic wave resonant filter 20 of lower frequency and the surface acoustic wave resonator 10a of the surface acoustic wave resonant filter 10 of high frequency. Here, the number of IDTs constituting the surface acoustic wave resonator 20a is disposed to be more than that of the IDTs constituting the surface acoustic wave resonator 10a. By adopting such a constitution, the surface acoustic wave resonant filter 20 of lower frequency can be easily formed with high attenuation. Thereby, in connecting two surface acoustic waves resonant filters, the insertion loss of the filter of lower frequency side can be prevented from increasing.

The passband of the surface acoustic wave resonant filter 10 is distanced on the higher frequency side than that of the surface acoustic wave resonant filter 20. Here, the passband of the surface acoustic wave resonant filter 10 is approximately 947 MHz and that of the surface acoustic wave resonant filter 20 is approximately 732 MHz, and the bandwidth thereof is approximately 25 MHz, respectively.

Al is formed in a film of a thickness of approximately 330 nm by depositing on the piezoelectric substrate by use of sputtering method. This conductive film is patterned to form the patterns of the IDTs, reflectors, bonding pads, and wiring followed. In this example, both surface acoustic wave resonant filters 10 and 20 are formed of a film of single layer of the same material and the same film thickness. Here, Al is used but Al with an addition of Cu, Si or the like may be used. Other conductive materials other than these can be used.

The electrode fingers of the surface acoustic wave resonant filters 10 and 20 are formed in such that the pitches of the filter 20 is larger than that of the filter 10 in accordance with the respective excitation wavelengths.

The film thickness of this conductive film is formed in the standardized film thickness of 7.7% seeing from the surface acoustic wave resonant filter 10 and of smaller 6% seeing from the surface acoustic wave resonant filter 20. It is difficult to form a broader band by the surface acoustic wave resonant filter 20 of lower frequency side. In the surface acoustic wave element of the present invention, however, the surface acoustic wave resonant filter 20 is formed with more IDTs (here, 5 IDTs) than the filter 10. Thereby, the kinds of extractable higher modes are increased to result in a broader band.

When the surface acoustic wave resonant filter 20 of lower frequency side is formed with a standardized film thickness of 7.7%, the standardized film thickness of the surface acoustic wave resonant filter 10 becomes such large as approximately 10%. As a result of this, the insertion loss of the surface acoustic wave resonant filter is remarkably increased. In the surface acoustic wave element of the present invention, the surface acoustic wave resonant filters 10 and 20 can be designed for the film thickness of the conductive film to be smaller standardized film thicknesses, respectively. Thereby, the surface acoustic wave resonant filter can be prevented from increasing in the insertion loss.

In the surface acoustic wave element 1, the surface acoustic wave resonant filters 10 and 20 are disposed along a direction perpendicular to a propagating direction of surface acoustic waves.

By constituting thus, in the surface acoustic wave element of the present invention, even when the number of reflection electrodes of the reflector is reduced to attain smaller size, one leakage surface acoustic wave does not affect so much adversely on the other surface acoustic wave resonant filter. In addition to this, bonding wires of the input/output can be disposed without crossing the IDTs of both surface acoustic wave resonant filters. As a result of this, the attenuation out of band due to inductance can be avoided to result in a surface acoustic wave element excellent in the attenuation out of band.

Thus, according to the surface acoustic wave element of the present invention, a two-port surface acoustic wave resonant filter of lower frequency side in which more large specific bandwidth is necessary, by increasing the IDT, can be constituted in a structure appropriate for broader band.

According to the surface acoustic wave element of the present invention, a plurality of surface acoustic wave resonant filters can be compositely formed on one piezoelectric substrate. Even in such a case, a plurality of surface acoustic wave resonant filters can be composed of a conductive film of the same material and of the same thickness. Accordingly, a plurality of surface acoustic wave resonant filters can be simultaneously formed in one process. There is no need of processing one filter while covering the other one with resist to obtain two filters of different thicknesses. As a result of this, productivity of the surface acoustic wave elements can be remarkably improved.

According to the surface acoustic wave element of the present invention, in connecting a plurality of surface acoustic wave resonant filters, both surface acoustic wave resonant filters can be formed with approximately equal bandwidth. In this case, for the surface acoustic wave resonant filter of higher frequency side that tends to be low attenuation in broader frequency band, the surface acoustic wave resonant filter with two ports that is less in the number of the IDTs is disposed. Accordingly, in the band of the surface acoustic wave resonant filter of lower frequency side, the high attenuation can be easily realized. Thereby, in connecting two surface acoustic wave resonant filters, the insertion loss of the surface acoustic wave resonant filter of lower frequency side can be prevented from increasing.

By adopting thus constituted surface acoustic wave filter of the present invention, a radio terminal used in, for instance, a communication system having a plurality of distanced passbands can be made small in size and low in cost.

Embodiment 2

Figure 2:
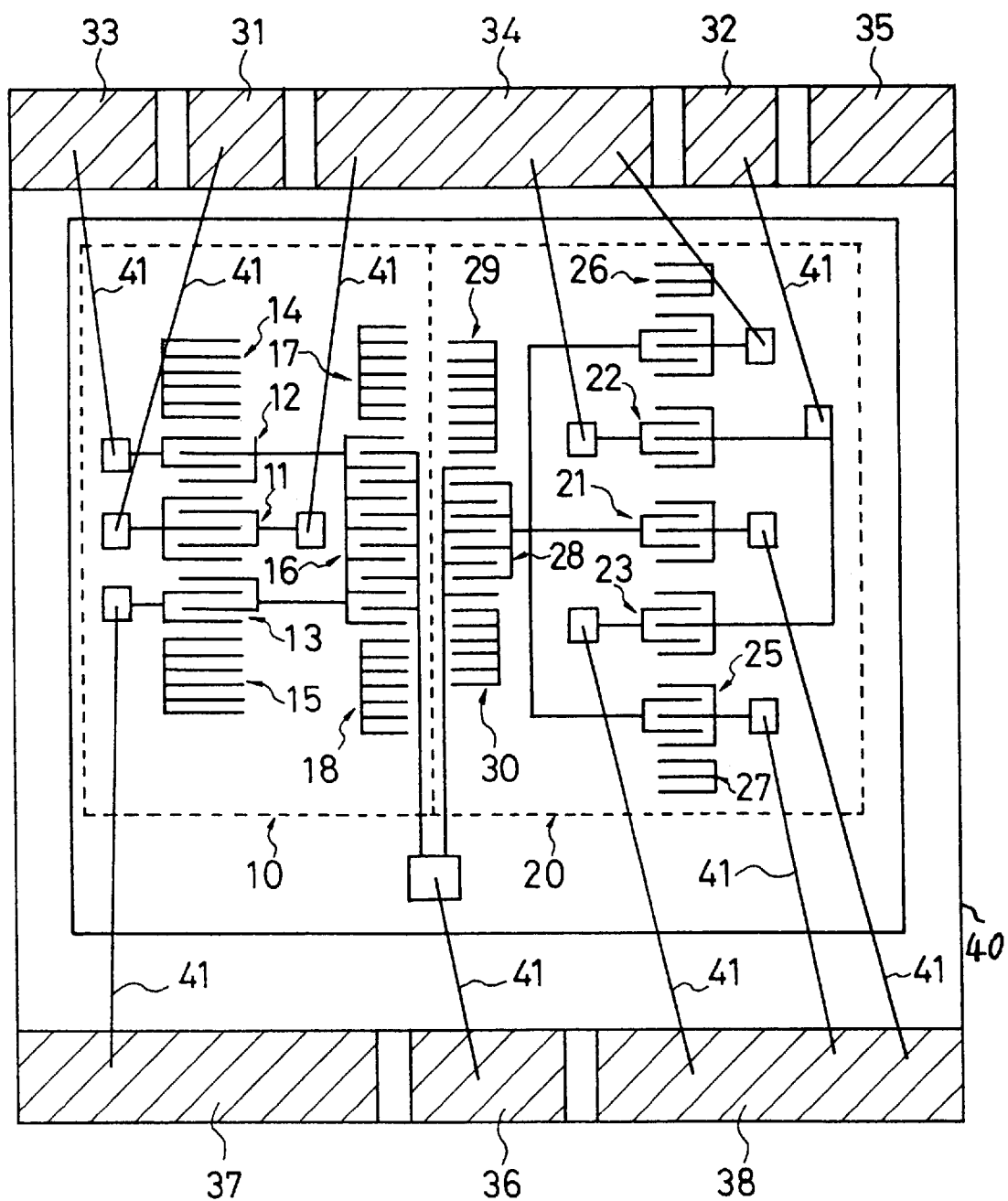
FIG. 2 is a diagram showing schematically an example of consideration of a surface acoustic wave device mounted on a package.

FIG. 2 is a diagram showing schematically an example of a constitution in which a surface acoustic wave element of the present invention is mounted on a package.

The package 40 has an area mounting a surface acoustic wave element 1. So as to face each other with this mounting area between them, input terminals 31 and 32 for inputting signals from external circuits and grounding terminals 33, 34 and 35, and an output terminal 36 for outputting signals to the external circuits and grounding terminals 37 and 38 are disposed.

The input terminals and grounding terminals of the package 40 and the corresponding electrodes of the surface acoustic wave element 1 are connected with bonding wires 41.

A direction of arrangement of the input terminals 31 and 32 and the output terminal 36 is constituted to be approximately parallel with a propagating direction of the surface acoustic waves of the surface acoustic wave resonant filters 10 and 20. As described in the above, in the surface acoustic wave element of the present invention, the surface acoustic wave resonant filters 10 and 20 are disposed in a direction approximately vertical to a propagating direction of the surface acoustic waves.

With such a constitution, the bonding wires 41 connecting the input/output terminals and the surface acoustic wave element 1 can be disposed without traversing an area on the IDTs of the respective surface acoustic wave resonant filters. Accordingly, the attenuation out of band due to induction can be decreased to improve performance out of band of the surface acoustic wave element.

In this case, the external shape of the piezoelectric substrate becomes a shape longer in a direction where two surface acoustic wave resonant filters are arranged in parallel. However, by giving the aforementioned relationship with the input/output pads, the longer side of the piezoelectric substrate can be matched with a direction of the longer side of the recess of the package 40.

Embodiment 3

Figure 3:
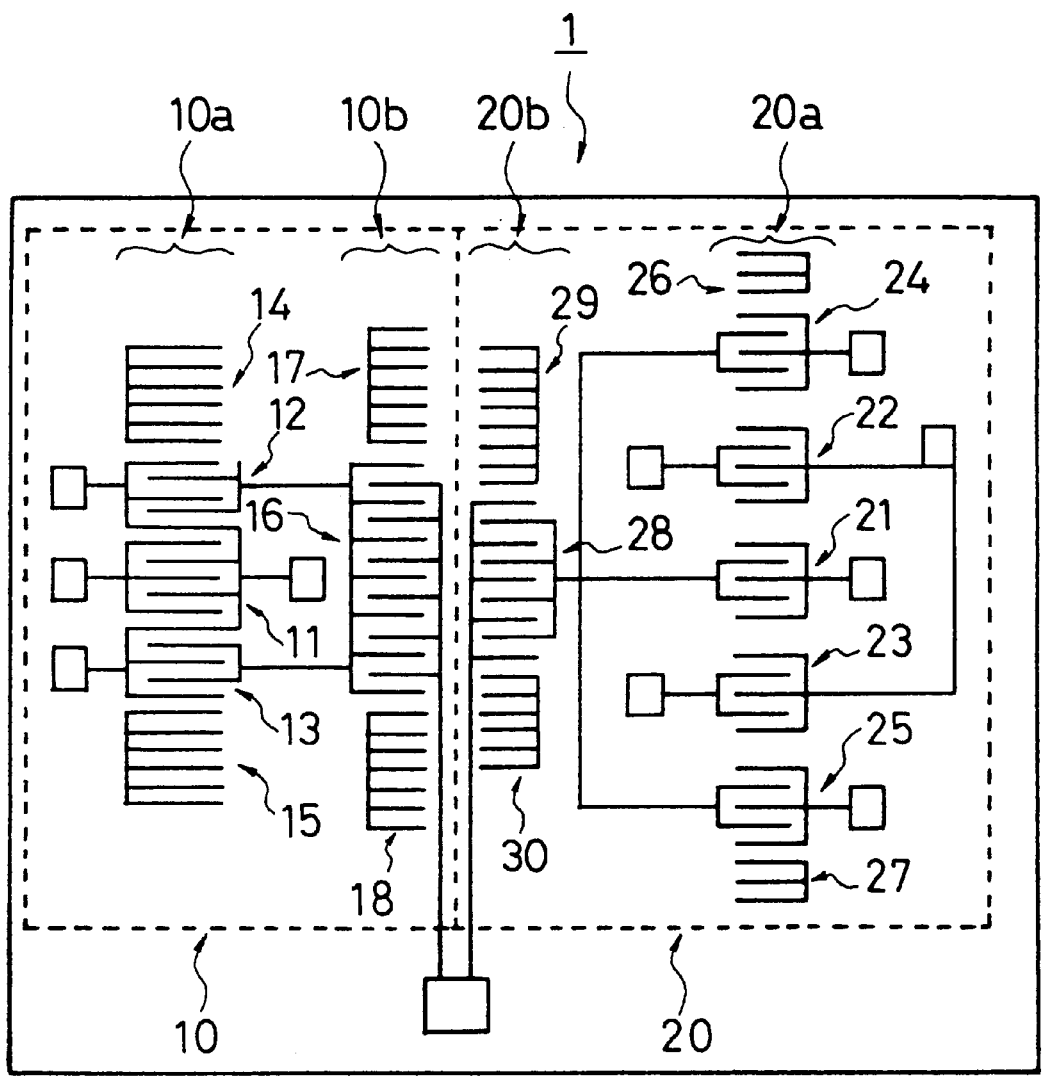
FIG. 3 is a diagram showing schematically another example of constitution of a surface acoustic wave device of the present invention.

FIG. 3 is a diagram showing schematically another constitution example of a surface acoustic wave element of the present invention.

In this surface acoustic wave element, the grounding electrodes of the IDTs 11, 12 and 13 constituting a surface acoustic wave resonator 10a of the surface acoustic wave resonant filter 10 of higher frequency side are connected to each other on the piezoelectric substrate.

The grounding electrodes of the IDTs constituting the IDT group constituting the surface acoustic wave resonant filter 20 of lower frequency side are disposed electrically independent from each other on the piezoelectric substrate.

One of IDTs of a surface acoustic wave resonator 10b constituting a surface acoustic wave resonant filter 10 and one of IDTs of a surface acoustic wave resonator 20b constituting the surface acoustic wave resonant filter 20 are connected in common at the output end.

By constituting like this, deterioration of performance out of band of the filter of higher frequency side due to connection of the filter of lower frequency side and deterioration of filter performance due to overlapping of the passband with this deteriorated band can be prevented from occurring.

Figure 4:
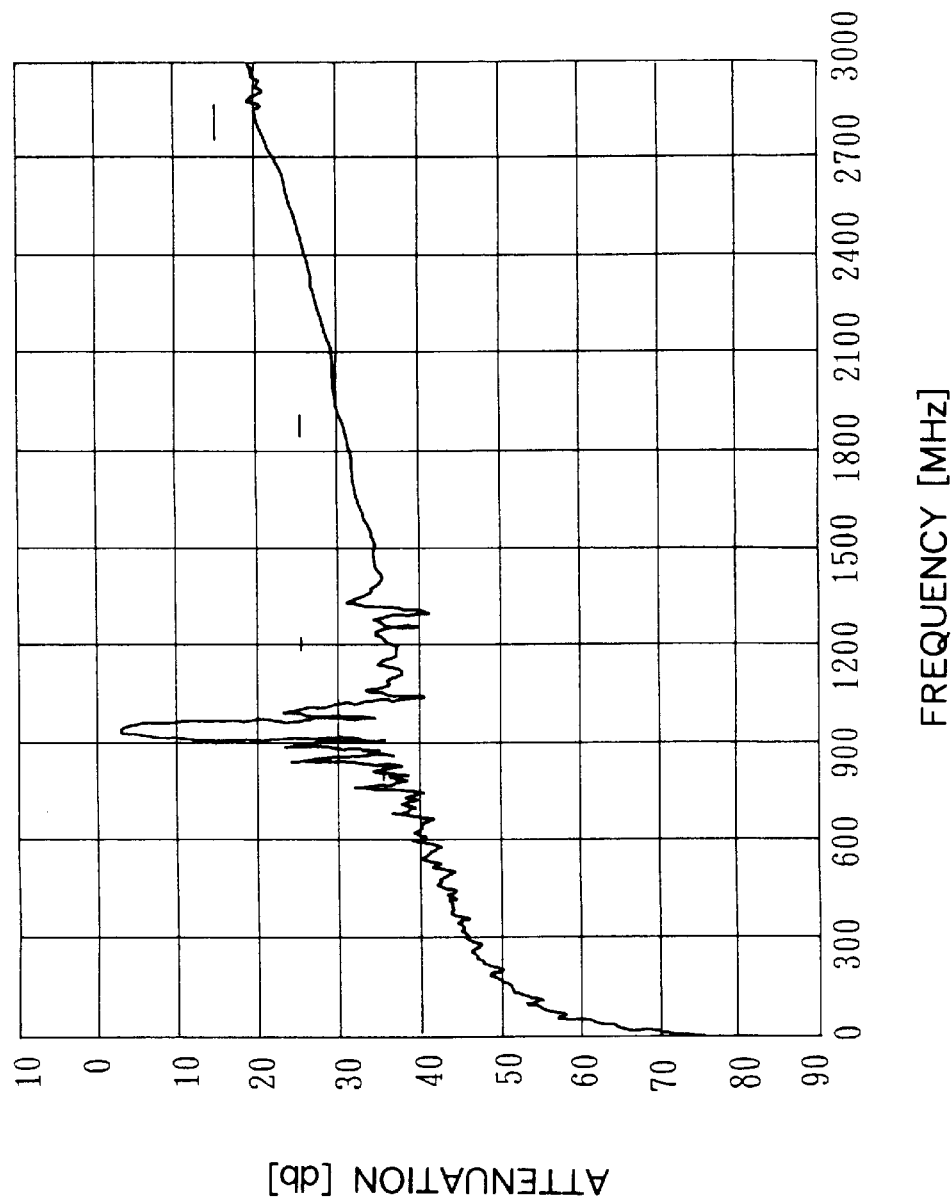
FIG. 4 is a diagram showing an example of frequency characteristics of a surface acoustic wave device of the present invention.
Figure 5:
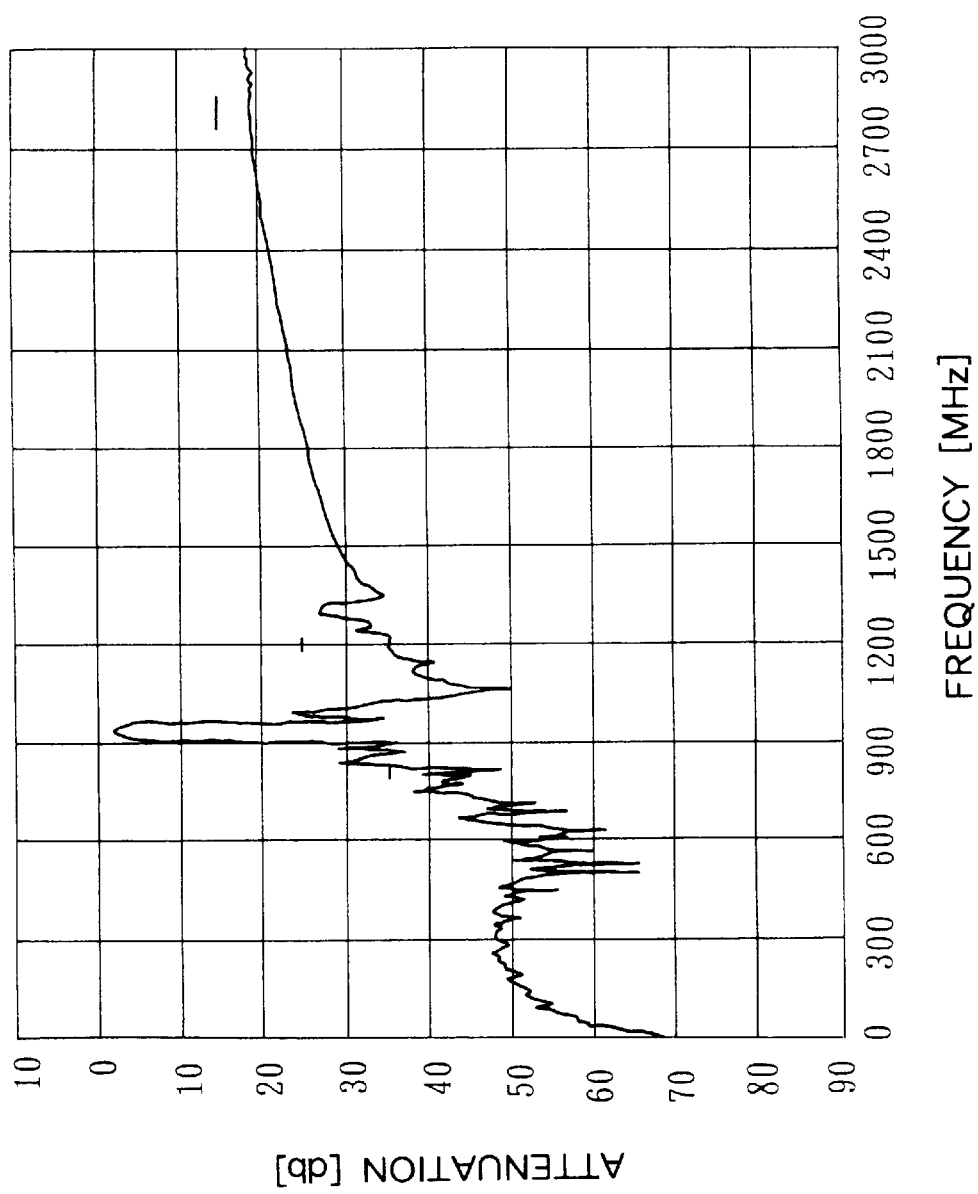
FIG. 5 is a diagram showing an example of frequency characteristics of a surface acoustic wave device of the present invention (when grounding electrode being connected).

FIGS. 4 and 5 are diagrams showing an example of frequency characteristics of the surface acoustic wave element of the present invention, respectively.

FIG. 4 shows performance when the grounding electrodes of the surface acoustic wave resonant filter 10 are not connected and FIG. 5 shows performance when the grounding electrodes of the surface acoustic wave resonant filter 10 are connected.

Capacitance is formed between the grounding electrode pattern on the piezoelectric substrate 2 of the single surface acoustic wave resonant filter and an package 40. Inductance is formed due to the bonding wires 41 and capacitance is formed between the grounding electrodes and signal lines. Though having resonance characteristics of broad band in general due to these capacitance and inductance, the high attenuation band due to these is shifted, in the surface acoustic wave resonant filter with two ports, towards the lower frequency side by connecting the grounding electrode pattern of the IDT.

In the characteristics illustrated in FIG. 4 for instance, there are traps in the vicinity of 1200 MHz. However, by connecting the IDTs of grounding side of the surface acoustic wave resonant filter 10 on the piezoelectric substrate, these traps are shifted to the neighborhood of 700 MHz.

Accordingly, by connecting grounding electrodes in the surface acoustic wave resonator 10a of the surface acoustic wave resonant filter 10 of higher frequency side, in the frequency band of the connected surface acoustic wave resonant filter 20, a high attenuation band can be obtained. However, when the grounding electrodes are similarly connected in the surface acoustic wave resonant filter 20, the magnitude of attenuation deteriorates in the frequency band of the surface acoustic wave resonant filter 10. Thereby, the insertion loss of the surface acoustic wave resonant filter 10 is deteriorated. Accordingly, in the surface acoustic wave element illustrated in FIG. 3 of the present invention, the grounding electrodes of the IDTs are not connected on the piezoelectric substrate in the surface acoustic wave resonant filter 20.

Thus, in the surface acoustic wave element of the present invention, by connecting the grounding electrodes of the IDTs of the surface acoustic wave resonant filter of higher frequency side on the piezoelectric substrate, the traps are shifted towards the lower frequency side. By overlapping the passband of the surface acoustic wave resonant filter of lower frequency in the vicinity of the shifted traps, the frequency performance of the surface acoustic wave element as a whole can be improved.

Embodiment 4

Figure 6:
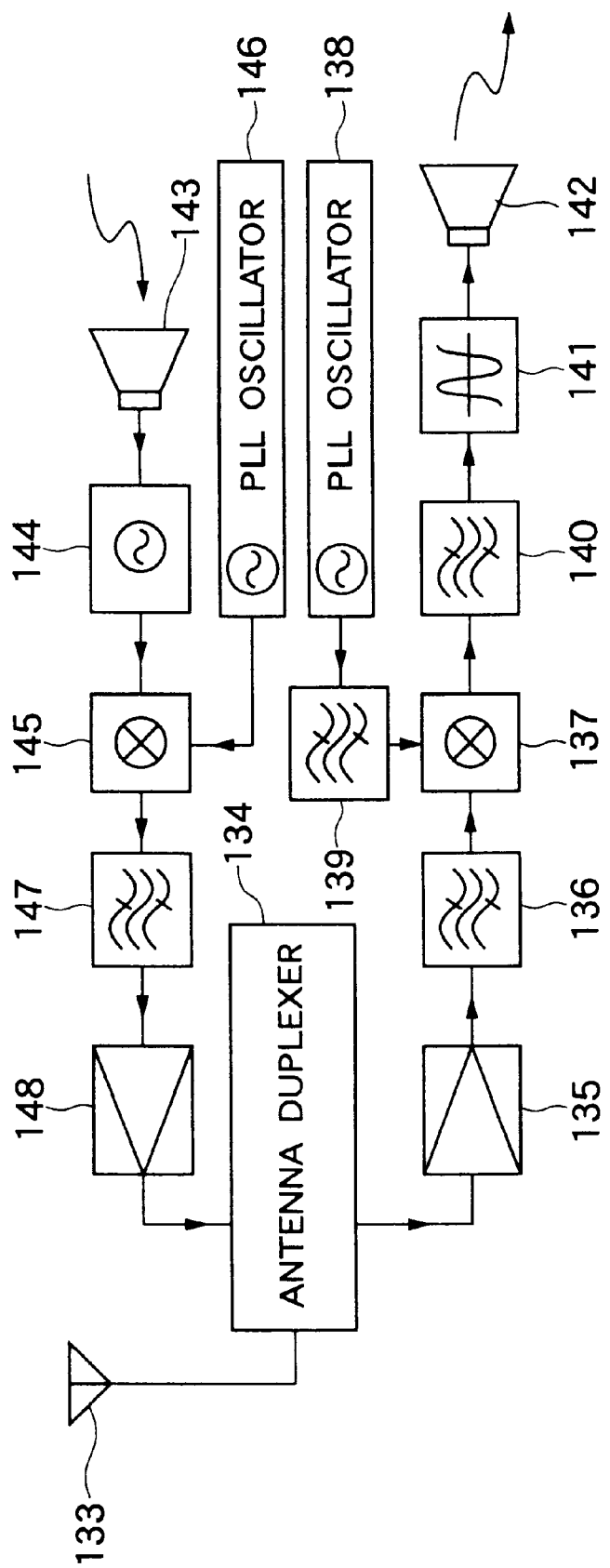
FIG. 6 is a block diagram showing a constitution of a radio terminal.

FIG. 6 is a block diagram showing one constitution example of a radio terminal capable of applying a surface acoustic wave element of the present invention. As the radio terminal, there are vehicular communication units such as, for instance, cellular phones and portable telephones.

In the figure, reference numeral 133 denotes an antenna. The waves received through this antenna 133 are separated into a receiving circuit by an antenna duplexer 134. After the received signal is amplified by use of a low noise amplifier (LNA) 135, the desired band is extracted by use of a receiving band-pass filter 136. To a mixer 137, a local oscillation signal oscillated by a PLL oscillator 138 is inputted through a local oscillation filter 139. The output of the mixer 137 is outputted through an IF filter 140 and a FM demodulator 141 from a speaker 142 as receiving sound.

On the other hand, transmitting sound inputted by use of a microphone 143 is inputted into a mixer 145 through a FM modulator 144. To the mixer 145, a local oscillation signal oscillated by use of a PLL oscillator 146 is inputted. The output compounded by use of the mixer 145 is outputted through a transmission band pass filter 147, a power amplifier 148 and the antenna duplexer 134 from the antenna 133 as a transmission wave.

In each portion of this radio terminal, a surface acoustic wave element is used.

For instance, in each of a receiving band-pass filter 136, a local oscillation filter 139, an antenna duplexer 134 and a transmission band-pass filter 147, a surface acoustic wave element is used as a filter of RF stage. In addition, in an IF filter 140 or the like, a surface acoustic wave element is used as a filter of the IF stage of narrow band indispensable for channel tuning. In addition, in a FM modulator 144 or the like, a surface acoustic wave element is used as a surface acoustic wave resonator in FM modulation of sounds.

The aforementioned surface acoustic wave element of the present invention can be applied in a filter of receiving stage, a filter of transmission stage or the like of such radio terminals.

In particular, there is a case where a single filter is desired to include a plurality of passbands for instance, a single filter is desired to correspond to a plurality of portable telephone systems. Besides, there is a case where the existing frequency band is broadened due to an increase of subscribers and this broadened band exists distanced from the original band. In these cases, by use of the surface acoustic wave element of the present invention, a plurality of frequency bands can be covered with one surface acoustic wave element. In particular, the surface acoustic wave elements of the present invention have a compact and productive structure. Accordingly, the radio terminals can be made smaller and the cost can be reduced.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

What is claimed is:

1. A surface acoustic wave element, comprising:

a piezoelectric substrate;

a first surface acoustic wave resonant filter having a first IDT group consisting of a conductive film disposed on the piezoelectric substrate to utilize longitudinal resonance mode coupling, and having a first passband; and a second surface acoustic wave resonant filter having a second IDT group consisting of a conductive film disposed on the piezoelectric substrate to utilize longitudinal resonance mode coupling, and having a second passband of higher frequency than that of the first passband;

wherein a number of IDTs constituting the first IDT group is more than that of the IDTs constituting the second IDT group.

2. The surface acoustic wave element as set forth in claim 1, wherein number of the IDTs constituting the first IDT group is selected from 3, 5, 7 and 9, and is more than that of the IDTs constituting the second IDT group.

3. The surface acoustic wave element as set forth in claim 1, wherein grounding electrodes of IDTs constituting the first IDT group are disposed electrically independent from each other on the piezoelectric substrate, the grounding electrodes of at least two of the IDTs disposed in a direction of excitation of surface acoustic waves among the second IDT group are connected on the piezoelectric substrate, and the first surface acoustic wave resonant filter and the second surface acoustic wave resonant filter comprise an output terminal connected in common on the piezoelectric substrate.

4. The surface acoustic wave element as set forth in claim 1, wherein a bandwidth of the first passband is approximately equal with or broader than that of the second passband.

5. The surface acoustic wave element as set forth in claim 1, wherein the first passband is in the range of from approximately 720 MHz to approximately 745 MHz, and the second passband is in the range of from approximately 930 MHz to approximately 960 MHz.

6. The surface acoustic wave element as set forth in claim 1, wherein the first passband is in the range of from approximately 810 MHz to approximately 830 MHz, and the second passband is in the range of from approximately 870 MHz to approximately 887 MHz.

7. The surface acoustic wave element as set forth in claim 1, wherein the first passband is in the range of from approximately 889 MHz to approximately 898 MHz, and the second passband is in the range of from approximately 925 MHz to approximately 960 MHz.

8. The surface acoustic wave element as set forth in claim 1, wherein the piezoelectric substrate is any one of 36° Y-cut X-transmission $LiTaO_3$, 64° Y-cut X-transmission $LiNbO_3$, or 41° Y-cut X-transmission $LiNbO_3$.

9. The surface acoustic wave element as set forth in claim 1, wherein the first surface acoustic wave resonant filter and the second surface acoustic wave resonant filter are disposed on the piezoelectric substrate along a direction approximately perpendicular to a direction of excitation of the surface acoustic waves.

10. The surface acoustic wave element as set forth in claim 1, wherein a pitch of electrode finger of the IDTs constituting the first IDT group is formed larger than that of the IDTs constituting the second IDT group.

11. A surface acoustic wave device, comprising:

a surface acoustic wave element comprising a piezoelectric substrate, a first surface acoustic wave resonant filter and a second surface acoustic wave resonant filter, the first surface acoustic wave resonant filter having a first IDT group consisting of a conductive film disposed on the piezoelectric substrate and a first passband, the second surface acoustic wave resonant filter having a second IDT group consisting of a conductive film disposed on the piezoelectric substrate and a second passband of higher frequency than that of the first passband, wherein number of IDTs constituting the first IDT group is more than that of the IDTs constituting the second IDT group; and a package that mounts the acoustic wave element, the package comprising:

a first input terminal to the first surface acoustic wave resonant filter, a second input terminal to the second surface acoustic wave resonant filter, and an output terminal from the first surface acoustic resonant filter and the second acoustic resonant filter, wherein the first and second input terminals and the output terminal are disposed in a direction of approximately parallel with a direction of excitation of surface acoustic waves of the surface acoustic wave element so as to face each other with the surface acoustic element between the first and second input terminals and the output terminal.

* * * * *